United States Patent [19]

Kato et al.

[11] Patent Number: 5,132,750
[45] Date of Patent: Jul. 21, 1992

[54] LIGHT-EMITTING DIODE HAVING LIGHT REFLECTING LAYER

[75] Inventors: Toshihiro Kato, Kasugai; Hiromoto Susawa, Tokai; Takashi Saka, Nagoya, all of Japan

[73] Assignee: Daido Tokushuko Kabushiki Kaisha, Nagoya, Japan

[21] Appl. No.: 616,092

[22] Filed: Nov. 20, 1990

[30] Foreign Application Priority Data

Nov. 22, 1989 [JP] Japan .................. 1-303538
Nov. 22, 1989 [JP] Japan .................. 1-303539

[51] Int. Cl.⁵ .......................................... H01L 33/00
[52] U.S. Cl. ........................................ 357/17; 357/16; 357/4; 357/52; 372/45; 372/44; 372/49
[58] Field of Search ............. 357/17, 16, 4, 52 C; 372/43, 44, 45, 46, 47, 48, 49, 50

[56] References Cited

U.S. PATENT DOCUMENTS

| | | | |
|---|---|---|---|
| 4,943,970 | 7/1990 | Bradley | 357/17 X |
| 4,949,350 | 8/1990 | Jewell et al. | 357/17 X |
| 4,993,036 | 2/1991 | Ikeda et al. | 372/45 X |
| 4,999,842 | 3/1991 | Huang et al. | 357/17 X |
| 5,040,044 | 8/1991 | Noguchi | 357/52 |

FOREIGN PATENT DOCUMENTS

| | | |
|---|---|---|
| 59-165475 | 9/1984 | Japan . |
| 60-77473 | 5/1985 | Japan . |
| 60-81888 | 5/1985 | Japan ................. 372/45 |
| 60-98689 | 6/1985 | Japan . |
| 62-51283 | 3/1987 | Japan ................. 372/45 |
| 01032690 | 5/1989 | Japan . |
| 1200678 | 8/1989 | Japan . |
| 01200678 | 11/1989 | Japan . |
| 1136218 | 12/1968 | United Kingdom . |

OTHER PUBLICATIONS

Journal of Vacuum Science and Technology: Part B., vol. 1, No. 1, Jan. 1983, New York US, pp. 72-73; A. K. Chin et al.: "A1203 As An Antireflection Coating For inP/InGaAsP LEDs".

Primary Examiner—William Mintel
Attorney, Agent, or Firm—Oblon, Spivak, McClelland, Maier & Neustadt

[57] ABSTRACT

A light-emitting diode having a light-generating layer for generating an electromagnetic radiation by electroluminescence, a light-emitting surface through which the radiation is emitted, and a light-reflecting layer remote from the light-emitting surface, for reflecting a portion of the radiation toward the light-generating layer so that the radiation reflected by the light-reflecting layer is also emitted through the light-emitting surface. The light-reflecting layer consists of two or more interference type reflecting layers which include one or more reflecting layers each capable of most efficiently reflecting a wave whose wavelength is longer than the nominal wavelength of the radiation. The light-emitting surface may have irregularity for irregularly reflecting the radiation, or an anti-reflection layer formed thereon by deposition.

19 Claims, 4 Drawing Sheets

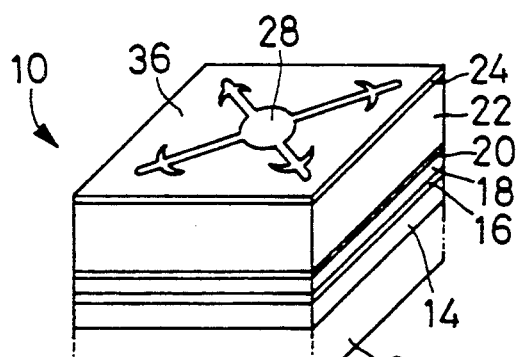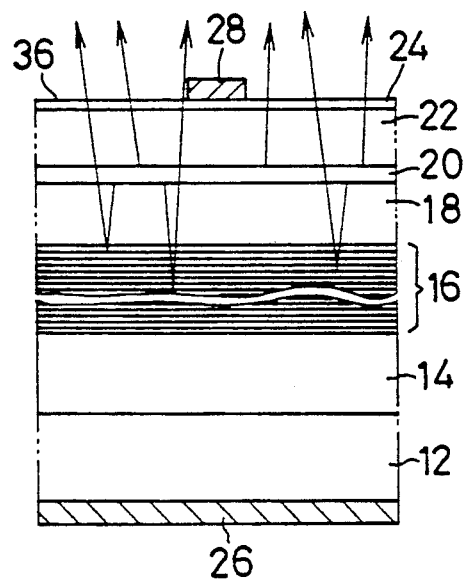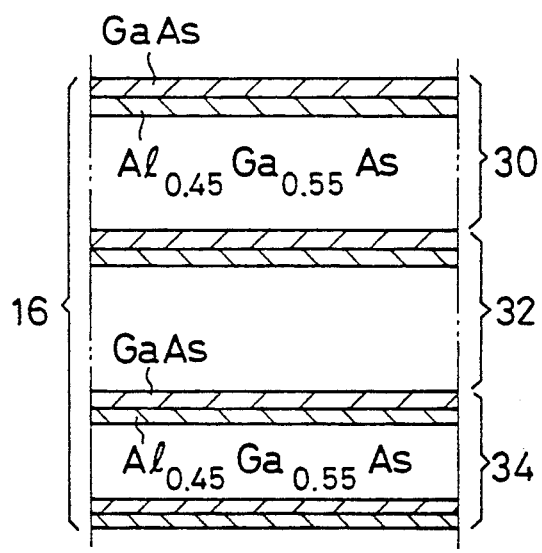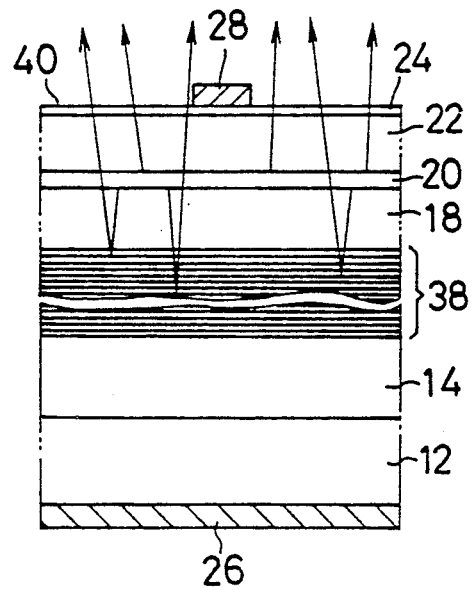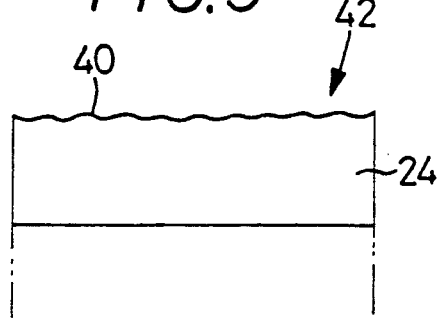

LIGHT-EMITTING DIODE HAVING LIGHT REFLECTING LAYER

BACKGROUND OF THE INVENTION

1. Field of the Invention

The present invention relates to improvements in a light-emitting diode having a light-reflecting layer.

2. Discussion of the Prior Art

Light-emitting diodes (LED) are widely used for optical data communication, and display or indicator devices, for example. Such light-emitting diodes are generally a semiconductor diode consisting of a pn junction formed on a semiconductor substrate by epitaxy, such as liquid phase epitaxy (LIE). An example of this type of light-emitting diode is disclosed in laid-open Publication No. 1-200678 of an unexamined Japanese Patent Application, and shown in FIG. 9. This light-emitting diode, indicated generally at 140, has a light-generating layer for generating an electromagnetic radiation by electroluminescence, a light-emitting surface 126 through which the radiation is emitted externally of the diode, and a light-reflecting layer 142 disposed on one of opposite sides of the light-generating layer which is remote from the light-emitting surface. The light-reflecting layer is adapted to reflect a portion of the radiation generated by the light-generating layer 116, toward the light-emitting surface 126 so that the radiation reflected by the light-reflecting layer 142 is also emitted through the light-emitting surface 126, for improving the light emitting efficiency of the diode 140. In the light-emitting diode 140 provided with the light-reflecting layer 142 as described above, the component of the radiation generated by the light-generating layer 116 which travels in the direction opposite to the direction from the light-generating layer 116 toward the light-emitting surface 126 is reflected by the light-reflecting layer 142, back toward the light-generating layer 116 so that the reflected component is added to the component which is received by the light-emitting surface 126 directly from the light-generating layer 116. Thus, the light-reflecting layer 142 improves the intensity of the light emitted from the light-emitting surface 126, i.e., the light-emitting efficiency of the LED.

The light-reflecting layer 142 incorporated in the known light-emitting diode 140 is a wave interference type light reflector, which most efficiently reflects a wave whose wavelength is the same as a predetermined nominal wavelength of the reflector. Namely, waves whose wavelengths are more or less different from the nominal wavelength are not efficiently reflected by the light-reflecting layer. Accordingly, the conventional light-reflecting layer 142 does not provide an intended increase in the light-emitting efficiency of the light-emitting diode.

Further, it was found that the provision of the light-reflecting layer 142 on the side of the light-generating layer 116 remote from the light-emitting surface 126 to improve the light emitting efficiency as described above may cause periodic irregular variations in the relative spectral intensity of the light emitted from the light-emitting surface 126, as indicated in FIG. 7, which prevents the practical use of the diode provided with the light-reflecting layer 142.

SUMMARY OF THE INVENTION

It is therefore a first object of the present invention to provide a light-emitting diode which has a light-reflecting layer and which assures a sufficiently high degree of light emitting efficiency.

A second object of the invention is to provide a light-emitting diode which has a light-reflecting layer and which emits a smooth spectrum of radiation.

The first object may be achieved according to one aspect of the present invention, which provides a light-emitting diode comprising a light-generating layer for generating an electromagnetic radiation by electroluminescence, a light-emitting surface through which the radiation is emitted externally of the diode, and a light-reflecting layer disposed on one of opposite sides of the light-generating layer which is remote from the light-emitting surface, the light-reflecting layer reflecting a portion of the radiation toward the light-generating layer so that the radiation reflected by the light-reflecting layer is also emitted through the light-emitting surface, the present light-emitting diode is characterized in that the light-reflecting layer consists of a plurality of wave interference type reflecting layers which includes at least one reflecting layer each of which is capable of most efficiently reflecting a wave whose wavelength is longer than a nominal wavelength of the electromagnetic radiation generated by the light-generating layer.

The light-emitting diode of the present invention constructed as described above was developed based on findings as a result of an extensive study by the inventors that the conventional light-reflecting layer cannot sufficiently efficiently reflect waves which are incident thereupon in directions which are inclined with respect to the incident surface, and that the light emitting efficiency of the light-emitting diode would be improved if the light-reflecting layer could efficiently reflect the waves incident in the inclined directions, as well as the orthogonally incident wave.

In the present light-emitting diode constructed as described above, the wave or waves having a longer wavelength or wavelengths than the nominal wavelength of the radiation generated by the light-generating layer can be reflected by at least one of the wave interference type reflecting layers disposed on one side of the light-generating layer remote from the light-emitting surface, whereby the wave or waves obliquely incident upon the light-reflecting layer can be efficiently reflected toward the light-generating layer and light-emitting surface, with a result of considerably improving the overall light emitting efficiency of the diode.

The second object of the invention may be achieved according to another aspect of the present invention, which provides a light-emitting diode comprising a light-generating layer for generating an electromagnetic radiation by electroluminescence, a light-emitting surface through which the radiation is emitted externally of the diode, and a light-reflecting layer disposed on one of opposite sides of the light-generating layer which is remote from the light-emitting surface, the light-reflecting layer reflecting a portion of the radiation toward the light-generating layer so that the radiation reflected by the light-reflecting layer is also emitted through the light-emitting surface, the present light-emitting diode being characterized in that the light-emitting surface has anti-reflection means for preventing the electromagnetic radiation from being reflected from the light-emitting surface toward the light-reflecting layer.

The light-emitting diode constructed as described above according to the second aspect of the invention was developed on findings as a result of an extensive study by the inventors on the known light-emitting diode, that a portion of the radiation which is generated by the light-generating layer and is incident upon the light-emitting surface is inevitably reflected by the light-emitting surface and received and reflected by the light-reflecting layer, and the reflected radiation is again incident upon the light-emitting surface and reflected toward the light-reflecting layer, whereby the radiation undergoes resonance between the light-emitting surface and the light-reflecting layer, which results in increasing the intensity of waves having certain wavelengths while decreasing the intensity of wavelengths between the wavelengths of the intensified waves, and that the light emitted from the light-emitting surface suffers from periodic irregular variations or changes in the spectral intensity, as indicated in FIG. 7.

In the light-emitting diode constructed according to the second aspect of the invention, the anti-reflection means provided functions to prevent the radiation incident upon the light-emitting surface from being reflected by the light-emitting surface toward the light-reflecting layer, thereby avoiding the conventionally experienced resonance of the light between the light-emitting surface and the light-reflecting surface. Consequently, the present light-emitting diode is free of periodic irregular variations in the spectral intensity of the light emitted from the light-emitting surface, and is capable of emitting light having a smooth spectrum.

The anti-reflection means may be irregularly consisting of minute projections and depressions formed on the light-emitting surface, for irregularly reflecting the radiation. Alternatively, the anti-reflection means may be an anti-reflection layer formed of a titanium oxide, for example, by vapor deposition on the light-emitting surface.

BRIEF DESCRIPTION OF THE DRAWINGS

The above and other objects, features and advantages of the present invention will be better understood by reading the following detailed description of presently preferred embodiments of the invention, when considered in connection with the accompanying drawings, in which:

FIG. 1 is a perspective view of one embodiment of a light-emitting diode of the present invention;

FIG. 2 is an elevational view in cross section of the light-emitting diode of FIG. 1;

FIG. 3 is an enlarged cross sectional view of a light-reflecting layer of the diode of FIG. 1;

FIG. 4 is an elevational view in cross section corresponding to that of FIG. 2, showing another embodiment of the invention;

FIG. 5 is an enlarged view of a light-emitting surface of the light-emitting diode of FIG. 4;

DETAILED DESCRIPTION OF THE PREFERRED EMBODIMENTS

Figure 6:
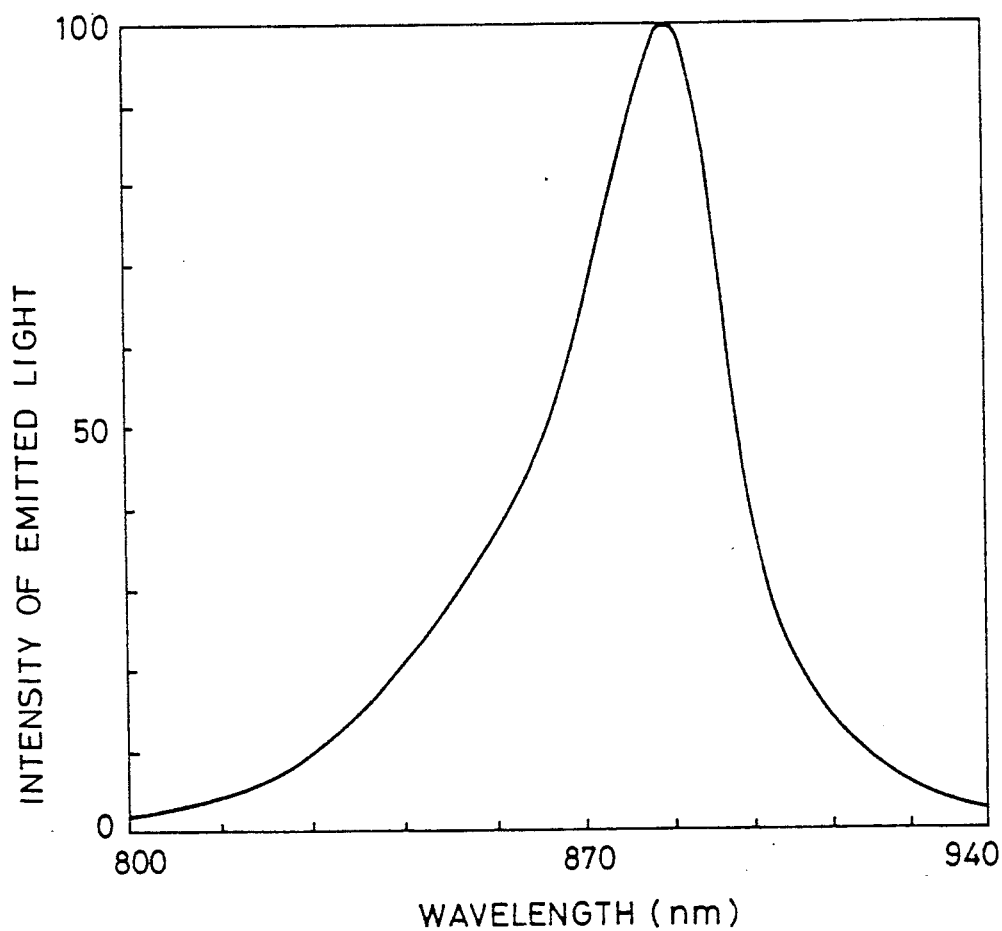
FIG. 6 is a graph indicating a relative spectral intensity of the light emitted by the diode of FIGS. 4 and 5.

Referring to the perspective and elevational views of FIGS. 1 and 2, reference numeral 10 denotes a planar emission type light-emitting diode having a double-heterodyne structure. The light-emitting diode 10 has an n-type GaAs single crystal substrate 12, an n-type $Ga_{1-0.55}Al_{0-0.45}As$ buffer layer 14 grown on the substrate 12, a light-reflecting layer 16 grown on the buffer layer 14, an n-type $Ga_{0.55}Al_{0.45}As$ clad layer 18 grown on the light-reflecting layer 16, a p-type GaAs light-generating layer 20 grown on the clad layer 18, a p-type $Ga_{0.55}Al_{0.45}As$ clad layer 22 grown on the light-reflecting layer 20, and a $p^+$-type GaAs contact layer 24 grown on the clad layer 22. The layers 14, 16, 18, 20, 22 have thicknesses on the order of 0.01 $\mu$m to several $\mu$m. On the surface of the n-type semiconductor substrate 12 remote from the buffer layer 14, there is formed an n-type Au-Ge ohmic electrode 26. The contact layer 24 has a light-emitting surface 36 on which is formed a p-type Au-Zn ohmic electrode 28.

The buffer layer 14, light-reflecting layer 16, n-type clad layer 18, light-generating layer 20, p-type clad layer 22 and contact layer 26 are sequentially grown each as a single crystal on the substrate 12 in the order of description, by metal organic chemical vapor deposition (MOCVD), molecular beam epitaxy (MBE) or vapor phase epitaxy (VPE), for example.

The light-reflecting layer 16 consists of three wave interference type reflecting layers 30, 32, 34 capable of reflecting waves of respective wavelength bands. The first reflecting layer 30 most remote from the substrate 12 consists of a superlattice consisting of fourteen films of GaAs each having a thickness of 62 nm, and fourteen films of $Al_{0.45}Ga_{0.55}As$ each having a thickness of 68 nm. The fourteen GaAs films and the fourteen $Al_{0.45}Ga_{0.55}As$ films are alternately superposed on each other to form the superlattice 30, which is adapted to be capable of most efficiently reflecting a wave having a wavelength of 895 nm which is orthogonally incident upon the light-reflecting layer 16. The second reflecting layer 32 on which the first reflecting layer 30 is grown consists of a superlattice consisting of seven films of GaAs each having a thickness of 60 nm, and seven films of $Al_{0.45}Ga_{0.55}As$ each having a thickness of 65 nm. The seven GaAs films and the seven $Al_{0.45}Ga_{0.55}As$ films are alternately superposed on each other to form the superlattice 32, which is adapted to be capable of most efficiently reflecting a wave having a wavelength of 860 nm which is orthogonally incident upon the light-reflecting layer 16. The third reflecting layer 34 which is grown on the buffer layer 14 and nearest to the substrate 12 consists of a superlattice consisting of twelve films of GaAs each having a thickness of 67 nm, and twelve films of $Al_{0.45}Ga_{0.55}As$ each having a thickness of 74 nm. The twelve GaAs films and the twelve $Al_{0.45}Ga_{0.55}As$ films are alternately superposed on each other to form the superlattice 34, which is adapted to be capable of most efficiently reflecting a wave having a wavelength of 968 nm which is orthogonally incident upon the light-reflecting layer 16.

The GaAs films and the $Al_{0.45}Ga_{0.55}As$ films of the light-reflecting layer 16 are alternately formed by alternately using respective material gases through a suitably controlled switch valve, while maintaining the substrate 12 and the buffer layer 14 at 850° C. within a processing chamber. The desired thicknesses of the individual GaAs and $Al_{0.45}Ga_{0.55}As$ films can be obtained by controlling the time durations for which the material gases are introduced into the chamber. More specifically, the GaAs films may be formed, for example, with flow rates of a TMG gas, a 10% dilution AsH3 gas and a 10 ppm dilution H2Se gas set at $2.2 \times 10^{-5}$ mole/min., 510 cc/min., and 28.3 cc/min., respectively. In this condition, the time of supply of the material gases is suitably determined to obtain the desired thickness of each GaAs film. On the other hand, the $Al_{0.45}Ga_{0.55}As$ films may be formed, for example, with flow rates of the TMG gas, a TMA gas, the 10% dilution AsH3 gas and the 10 ppm dilution H2Se gas set at $2.2 \times 10^{-5}$ mole/min., $7.8 \times 10^{-6}$ mole/min., 511 cc/min., and 28.3 cc/min., respectively. In this condition, the time of supply of the material gases is suitably determined to obtain the desired thickness of each $Al_{0.45}Ga_{0.55}As$ film. Between the supply period of the material gases for the GaAs films and the supply period the material gases for the $Al_{0.45}Ga_{0.55}As$ films, an AsH3 gas is supplied to replace the residual atmosphere in the chamber for 10 seconds.

In operation of the present light-emitting diode 10 constructed as described above, a drive current is applied between the ohmic electrodes 26, 28, whereby a non-coherent electromagnetic radiation having a nominal wavelength of 880 nm is generated by the light-generating layer 20. A component of the radiation generated by the light-generating layer 20 is incident upon the contact layer 24 having the light-emitting surface 36, and the incident component is emitted from the light-emitting surface 36, externally of the diode 10. At the same time, a component of the generated radiation is directed toward the substrate 12 and is incident upon the light-reflecting layer 16, whereby that component is reflected by the light-reflecting layer 16 toward the light-generating layer 20, transmitted through the layer 20 and finally emitted through the light-emitting surface 36. The component incident upon the light-reflecting layer 16 includes waves whose direction of propagation is inclined with respect to the plane of the light-reflecting layer 16, as well as a wave whose direction of propagation is perpendicular or orthogonal or almost perpendicular or orthogonal to the plane of the layer 16. Since the light-reflecting layer 16 includes the first and third reflecting layers 30, 34 capable of most efficiently reflecting the waves whose wavelengths are longer than the nominal wavelength of 880 nm of the radiation generated by the light-generating layer 20, the waves which are obliquely incident upon the light-reflecting layer 16 can also be efficiently reflected by the layer 16 (by the first and third reflecting layers 30, 34). Further, a wave whose wavelength is shorter than the nominal wavelength of 880 nm can be reflected by the second reflecting layer 32, which most efficiently reflect the wave whose wavelength is 860 nm. Accordingly, the light emitting efficiency of the present light-emitting diode 10 is increased by several tens of percent as compared with that of the conventional light-emitting diode wherein the wave interference type light-reflecting layer efficiently reflects only the component of the generated radiation which is incident thereupon in the direction perpendicular to its plane.

Further, the present light-emitting diode 10 can be easily produced at a comparatively low cost, by sequentially or successively growing by epitaxy the constituent layers (buffer layer 14, light-reflecting layer 16, n-type clad layer 18, light-generating layer 20, p-type clad layer 22 and contact layer 24), while the substrate 12 is held placed in the processing chamber. The epitaxial growth of the constituent layers on the substrate 12 may be suitably effected, for example, by MOCVD (metal organic chemical vapor deposition), MBE (molecular beam epitaxy) or VPE (vapor phase epitaxy). For easy, uniform formation of the GaAs/AlGaAs superlattices with accurately controlled thicknesses, the MOCVD process is particularly recommended.

The GaAs/AlGaAs superlattices 30, 32, 34 of the light-reflecting layer 16 do not suffer from lattice mismatch with respect to the n-type GaAs substrate 12 and the n-type $Ga_{0.55}Al_{0.45}As$ buffer layer 14.

While the third reflecting layer 34 is formed on the buffer layer 14 and the second and first reflecting layers 32, 30 are formed on the third and second reflecting layers 34, 32, respectively, the positions of these reflecting layers 30, 32, 34 with respect to each other are not limited to those in the illustrated embodiment.

Referring next to FIGS. 4 and 5, another embodiment of the invention will be described. In the interest of brevity and simplification, the same reference numerals as used in the first embodiment will be used in FIGS. 4 and 5 to identify the corresponding components, and no redundant description of these components will be provided.

A light-emitting diode according to this second embodiment is indicated at 37 in FIG. 4. The light-emitting diode 37 is identical with the light-emitting diode 10 of the first embodiment, except for a light-reflecting layer 38 and a light-emitting surface 40 provided by the $p^+$-type GaAs contact layer 24. More specifically, the light-reflecting layer 38 is a wave interference type reflector provided by a superlattice consisting of ten GaAs films and ten $Al_{0.45}Ga_{0.55}As$ films which have thicknesses on the order of tens of $\mu m$ and which are alternately superposed on each other. These films are formed in the same manner as described above with respect to the light-reflecting layer 16 of the first embodiment. The superlattice of the light-reflecting layer 38 is adapted to most efficiently reflect the wave whose wavelength is the same as the nominal wavelength of 880 nm of the radiation generated by the light-generating layer 20.

The contact layer 24 provides a light-emitting layer 40 from which the radiation generated by the light-generating layer 20 is emitted externally of the diode 37. As shown in enlargement in FIG. 5, the light-emitting surface 40 has irregularity consisting of minute projections and depressions as indicated at 42. The irregularity 42 functions to irregularly reflect the incident radiation, thereby preventing the radiation from being reflected from the light-emitting surface 40 toward the light-reflecting layer 38. The irregularity 42 may be formed by immersing the contact layer 42 (light-emitting surface 40) in an etching solution, for five minutes at the ambient temperature, for example. The etching solution may consist of 3 parts by volume of $H_3PO_4$, 1 part by volume of $H_2O_2$ and 21 parts by volume of $H_2O$.

Figure 7:
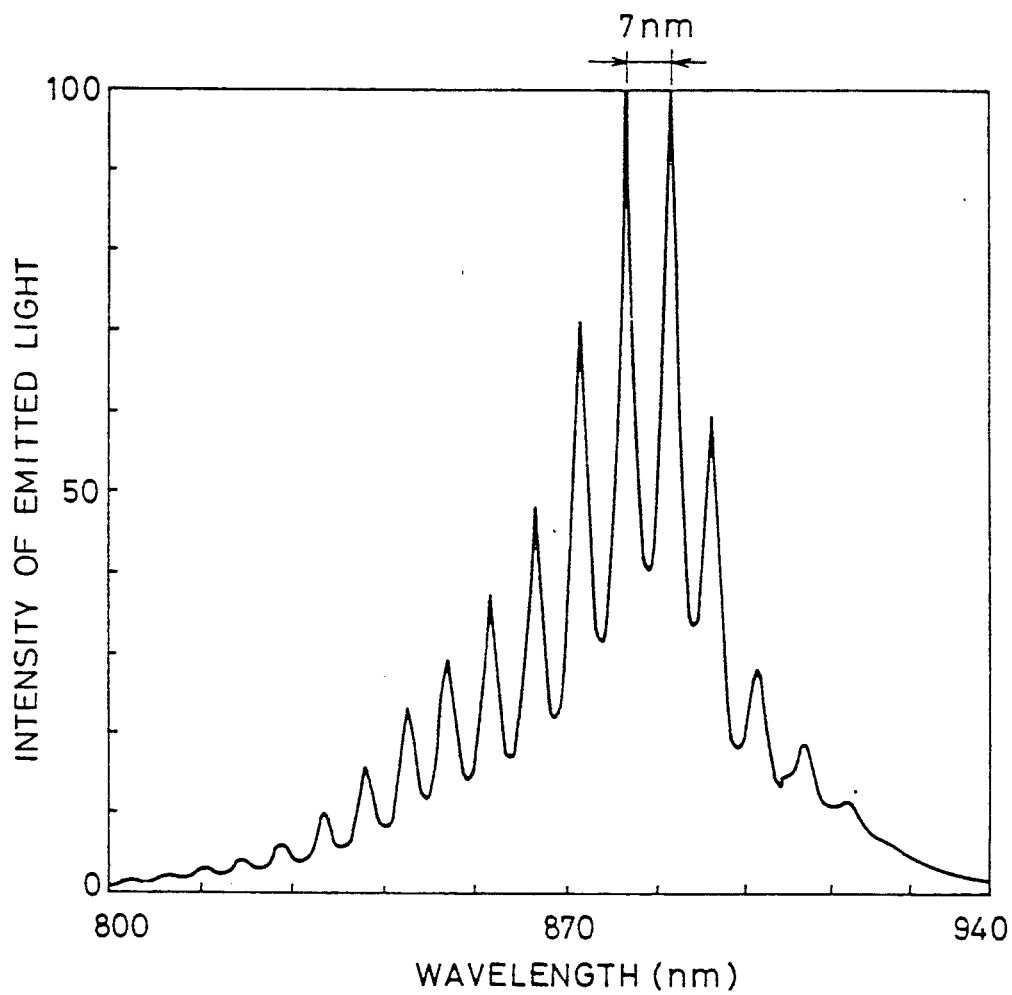
FIG. 7 is a graph indicating a relative spectral intensity of the light emitted by the know light-emitting diode of FIG. 9.
Figure 9:
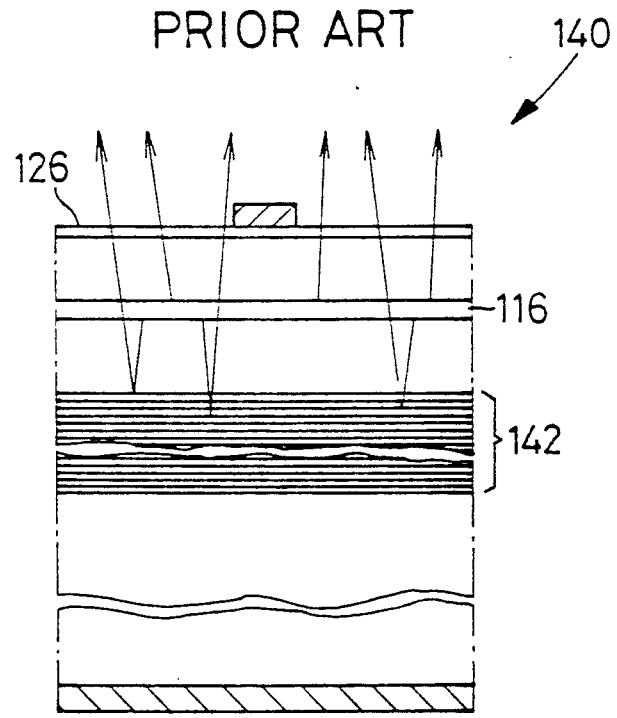
FIG. 9 is an elevational view in cross section of a prior art light-emitting diode.

As in the first embodiment, a portion of the radiation generated by the light-generating layer 20 is directly incident upon the contact layer 24, while a portion of the generated radiation is reflected by the light-reflecting layer 38 and is incident upon the contact layer 24 through the light-generating layer 20. The generated radiation is thus emitted through the 0 light-emitting surface 40. In the known light-emitting diode, a component of the radiation incident upon the light-emitting surface tends to be reflected by the light-emitting surface toward the light-reflecting layer. In the present light-emitting diode 37, however, the minute 5 projections and depressions of the irregularity 42 formed on the light-emitting surface 40 function to prevent or minimize the amount of the radiation which is reflected by the light-emitting surface 40 toward the light-reflecting layer 38, thereby avoiding or minimizing the optical resonance light between the light-emitting surface 40 and the light-reflecting layer 38. Accordingly, the present light-emitting diode 37 is capable of emitting a radiation having a smooth spectrum, wherein the intensity of the emitted light is the highest at the wavelength of 880 nm, nominal wavelength of the radiation generated by the light-generating layer 20. Namely, the relative spectral intensity of the emitted light smoothly or gradually decreases as the wavelength decreases and increases from the nominal wavelength of 880 nm as shown in FIG. 6. This is compared with a spectrum of FIG. 7 of the light emitted from the known diode 140 of FIG. 9 in which the light-emitting surface 126 does not have irregularity as provided in the present diode 37.

Figure 8:
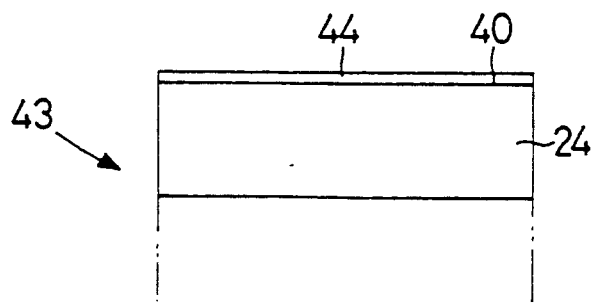
FIG. 8 is a view corresponding to that of FIG. 5, showing a further embodiment of the invention, alternative to the arrangement of FIG. 5.

Referring to FIG. 8, there will be described a further embodiment of the present invention, which is alternative to the embodiment of FIG. 5 in which the irregularity 42 is provided on the light-emitting surface 40.

In this modified light-emitting diode indicated at 43 in FIG. 8, an anti-reflection layer 44 is formed on the light-emitting surface 40 provided by the contact layer 24. This anti-reflection layer 44, which is substituted for the irregularity 42 in the preceding embodiment, is a wave interference type reflector. This reflector may be formed, for example, by vapor deposition or anodization (anodic oxidation) within a vacuum processing chamber, using a pellet of titanium dioxide ($TiO_2$: titania), silicon dioxide ($SiO_2$: silica) or $Si_3N_4$. The anti-reflection layer 44 may have a thickness of about 110 nm. Like the irregularity 42, this anti-reflection layer 44 is also effective to prevent or minimize the amount of the light reflected from the light-emitting layer 40 toward the light-reflecting layer 38, thereby avoiding the optical resonance between the light-emitting surface 40 and the light-reflecting layer 38, and assuring a smooth spectrum of the externally emitted light as indicated in the graph of FIG. 6.

While the present invention has been described in the presently preferred embodiments with a certain degree of particularity, for illustrative purpose only, it is to be understood that the invention is not limited to the details of the illustrated embodiments, and may be embodied with various changes, modifications and improvements.

For instance, the light-reflecting layer 38 used in the diodes 37, 43 of the second and third embodiments of FIGS. 4, 5 and 8 may be replaced by a light-reflecting layer which consists of two or more superlattices, such as the light-reflecting layer 16 in the first embodiment.

While the illustrated light-emitting diodes 10, 5 37, 43 have a GaAs/AsGaAs double-heterodyne structure, other compound semiconductors such as GaP, InP and InGaAsP may be utilized to constitute a double-heterodyne structure. Further, the diode may have a single-heterodyne or homodyne structure.

The light-reflecting layer 16, 38 used in the illustrated embodiments use a GaAs/AlGaAs superlattice or superlattices, the light-reflecting layer may be formed of other semiconductor materials, which are selected with the refractive index taken into consideration. For instance, the light-reflecting layer may be a superlattice or superlattices of GaAs/AlAs. $Ga_{1-x}Al_xAs/Ga_{1-y}Al_yAs$ or GaAlAs/AlAs.

In the illustrated embodiments, the light-generating layer 20 and the light-reflecting layer 16, 8 are formed parallel to each other. However, the light-generating and light-reflecting layers need not be parallel to each other. Further, the light-generating layer may have a smaller surface area than the other layers.

It is to be understood that the present invention may be embodied with various other changes, modifications and improvements, which may occur to those skilled in the art, without departing from the spirit and scope of the invention defined in the following claims.

What is claimed is:

1. A light-emitting diode comprising a light-generating layer for generating an electromagnetic radiation by electroluminescence, a light-emitting surface through which said radiation is emitted externally of the diode, and a light-reflecting layer disposed on one of opposite sides of said light-generating layer which is remote from said light-emitting surface, said light-reflecting layer reflecting a portion of said radiation toward said light-generating layer so that the radiation reflected by said light-reflecting layer is also emitted through said light-emitting surface, wherein the improvement comprises:
said light-reflecting layer consisting of a plurality of wave interference type reflecting layers which includes at least one reflecting layer each of which is capable of most efficiently reflecting a wave whose wavelength is longer than a nominal wavelength of said electromagnetic radiation generated by said light-generating layer.

2. A light-emitting diode according to claim 1, wherein each of said plurality of wave interference type reflecting layers consists of a superlattice consisting of a plurality of compound semiconductor films which are superposed on each other and each of which has a thickness on the order of tens of nanometers.

3. A light-emitting diode according to claim 2, wherein said superlattice consists of a GaAs-AlGaAs superlattice.

4. A light-emitting diode according to claim 1, wherein said light-generating layer generates electromagnetic radiation having a nominal wavelength of 880 nm, said at least one reflecting layer including a layer capable of most efficiently reflecting a wave having a nominal wavelength of 895 nm.

5. A light-emitting diode according to claim 1, wherein said light-generating layer generates electromagnetic radiation having a nominal wavelength of 880 nm, said at least one reflecting layer including a layer capable of most efficiently reflecting a wave having a nominal wavelength of 968 nm.

6. A light-emitting diode according to claim 1, wherein said plurality of wave interference type reflecting layers consists of a first reflecting layer capable of most efficiently reflecting a wave whose wavelength is longer than said nominal wavelength of said electromagnetic radiation, a second reflecting layer capable of most efficiently reflecting a wave whose wavelength is shorter than said nominal wavelength of said electromagnetic radiation, and a third reflecting layer capable of most efficiently reflecting a wave whose wavelength is longer than said wavelength of the wave reflected by said first reflecting layer.

7. A light-emitting diode according to claim 6, wherein said light-generating layer generates electromagnetic radiation having a nominal wavelength of 880 nm, said first, second and third reflecting layer being capable of most efficiently reflecting waves having nominal wavelengths of 895 nm, 860 nm and 968 nm, respectively.

8. A light-emitting diode according to claim 1, wherein said light-emitting surface has anti-reflection means for preventing said electromagnetic radiation from being reflected from said light-emitting surface toward said light-reflecting layer.

9. A light-emitting diode according to claim 8, wherein said anti-reflection means consists of an irregularity consisting of minute projections and depressions formed on said light-emitting surface, said minute irregularity irregularly reflecting said electromagnetic radiation reflected toward said light-reflecting layer.

10. A light-emitting diode according to claim 9, wherein said irregularity is formed by etching said light-emitting surface.

11. A light-emitting diode according to claim 8, wherein said anti-reflection means consists of an anti-reflection layer formed by vapor deposition of titanium oxide on said light-emitting surface.

12. A light-emitting diode according to claim 24, wherein said irregularity is formed by etching said light-emitting surface.

13. A light-emitting diode according to claim 19, wherein said light-reflecting layer consists of a superlattice consisting of a plurality of compound semiconductor films which are superposed on each other and each of which has a thickness on the order of tens of nanometers.

14. A light-emitting diode according to claim 13, wherein said superlattice consists of a GaAs-AlGaAs superlattice.

15. A light-emitting diode according to claim 19, wherein said light-generating layer generates electromagnetic radiation having a nominal wavelength of 880 nm, said light-reflecting layer being capable of most efficiently reflecting a wave having a nominal wavelength of 880 nm.

16. A light-emitting diode according to claim 19, further comprising an n-type GaAs single crystal substrate, an n-type $Ga_{1-0.55}Al_{0-0.45}As$ buffer layer which is grown on said substrate and on which said light-reflecting layer is grown, an n-type $Ga_{0.55}Al_{0.45}As$ clad layer which is grown on said light-reflecting layer and on which said light-generating layer is grown, a p-type $Ga_{0.55}Al_{0.45}As$ clad layer grown on said light-generating layer, and a p+-type GaAs contact layer which is grown on said p-type $Ga_{0.55}Al_{0.45}As$ clad layer and which has said light-emitting surface.

17. A light-emitting diode comprising a light-generating layer for generating electromagnetic radiation by electroluminescence, a light-emitting surface through which said radiation is emitted externally of the diode, and a light-reflecting layer disposed on one of opposite sides of said light-generating layer which is remote from said light-emitting surface, said light-reflecting layer reflecting a portion of said radiation toward said light-generating layer so that the radiation reflected by said light-reflecting layer is also emitted through said light-emitting surface, wherein the improvement comprises:
said electromagnetic radiation generated by said light-generating layer has a nominal wavelength of 880 nm, and said light-reflecting layer consisting of a first reflecting layer capable of most efficiently reflecting a wave whose wavelength is 895 nm, a second reflecting layer capable of most efficiently reflecting a wave whose wavelength is 860 nm, and a third reflecting layer capable of most efficiently reflecting a wave whose wavelength is 968 nm; and
said first reflecting layer consisting of a superlattice consisting of fourteen GaAs films each having a thickness of 62 nm, and fourteen $Al_{0.45}Ga_{0.55}As$ films each having a thickness of 68 nm, said fourteen GaAs films and said fourteen $Al_{0.45}Ga_{0.55}As$ films being alternately superposed on each other, said second reflecting layer consisting of a superlattice consisting of seven GaAs films each having a thickness of 60 nm, and seven $Al_{0.55}Ga_{0.55}As$ films each having a thickness of 65 nm, said seven GaAs films and said seven $Al_{0.45}Ga_{0.55}As$ films being alternately superposed on each other, said third reflecting layer consisting of a superlattice consisting of twelve GaAs films each having a thickness of 67 nm, and twelve $Al_{0.45}Ga_{0.55}As$ films each having a thickness of 74 nm, said twelve GaAs films and said twelve $Al_{0.45}Ga_{0.55}As$ films being alternately superposed on each other.

18. A light-emitting diode comprising a light-generating layer for generating electromagnetic radiation by electroluminescence, a light-emitting surface through which said radiation is emitted externally of the diode, and a light-reflecting layer disposed on one of opposite sides of said light-generating layer which is remote from said light-emitting surface, said light-reflecting layer reflecting a portion of said radiation toward said light-generating layer so that the radiation reflected by said light-reflecting layer is also emitted through said light-emitting surface, wherein the improvement comprises:
said light-reflecting layer consisting of a plurality of wave interference type reflecting layers which includes at least one reflecting layer capable of most efficiently reflecting a wave whose wavelength is longer than a nominal wavelength of said electromagnetic radiation generated by said light-generating layer, each of said plurality of wave interference type reflecting layers consisting of a GaAs-AlGaAs superlattice consisting of a plurality of compound semiconductor films which are superposed on each other and each of which has a thickness on the order of tens of nanometers, and
said light-emitting diode further comprising an n-type GaAs single crystal substrate an n-type $Ga_{1-0.55}Al_{0-0.45}As$ buffer layer which is grown on said substrate and on which said GaAs-AlGaAs superlattice of said light-reflecting layer is grown, an n-type $Ga_{0.55}Al_{0.45}As$ clad layer which is grown on said GaAs-AlGaAs superlattice and on which said light-generating layer is grown, a p-type $Ga_{0.55}Al_{0.45}As$ clad layer grown on said light-generating layer, and a p+type GaAs contact layer which is grown on said p-type $Ga_{0.55}Al_{0.45}As$ clad layer and which has said light-emitting surface, said light-generating layer being a p-type GaAs layer.

19. A light-emitting diode comprising a light-generating layer for generating electromagnetic radiation by electroluminescence, a light-emitting surface through which said radiation is emitted externally of the diode, and a light-reflecting layer disposed on one of opposite sides of said light-generating layer which is remote from said light-emitting surface, said light-reflecting layer reflecting a portion of said radiation toward said light-generating layer so that the radiation reflected by said light-reflecting layer is also emitted through said light-emitting surface, wherein the improvement comprises:

said light-emitting layer having anti-reflection means for preventing said electromagnetic radiation from being reflected from said light-emitting surface toward light-reflecting layer, said anti-reflection means consisting of an irregularity consisting of minute projections and depressions formed on said light-emitting surface, said irregularity irregularly reflecting said electromagnetic radiation reflected toward said light-reflecting layer.

* * * * *